United States Patent [19]
Maejima

[11] Patent Number: 6,153,941
[45] Date of Patent: Nov. 28, 2000

[54] SEMICONDUCTOR REGISTRATION MEASUREMENT MARK

[75] Inventor: Shinroku Maejima, Hyogo, Japan

[73] Assignee: Mitsubishi Denki Kabushiki Kaisha, Tokyo, Japan

[21] Appl. No.: 09/231,630

[22] Filed: Jan. 15, 1999

[30] Foreign Application Priority Data

Sep. 2, 1998 [JP] Japan .................................. 10-248308

[51] Int. Cl.⁷ ....................... H01L 23/544; H01L 21/76; H01L 21/46; H01L 21/78; H01L 21/301

[52] U.S. Cl. ..................... 257/797; 257/620; 438/401; 438/462; 438/975

[58] Field of Search ................................. 257/620, 797; 438/401, 462, 975

[56] References Cited

U.S. PATENT DOCUMENTS 5,949,547  9/1999  Tseng et al. ............................ 356/375
5,969,428  10/1999  Nomura et al. ........................ 257/797

FOREIGN PATENT DOCUMENTS 7-045507  2/1995  Japan .

Primary Examiner—David Hardy
Assistant Examiner—Allan R. Wilson
Attorney, Agent, or Firm—McDermott, Will & Emery

[57] ABSTRACT

On a semiconductor substrate, a registration measurement mark and intended patterns monitored by the registration measurement mark are provided. Step or level difference between the surface of registration measurement mark and the surface of intended patterns is made to be within ±0.2 μm. By such structure, it becomes possible to accurately monitor the intended patterns by utilizing the registration measurement mark.

6 Claims, 9 Drawing Sheets

SEMICONDUCTOR REGISTRATION MEASUREMENT MARK

BACKGROUND OF THE INVENTION

1. Field of the Invention

The present invention generally relates to a semiconductor device and, more specifically, to a semiconductor device having a registration measurement mark used in a step of lithography.

2. Description of the Background Art

The registration measurement mark is used for measuring registration accuracy between two steps of lithography. A conventional method of manufacturing a semiconductor device including the steps of lithography will be described.

Referring to FIG. 13, a semiconductor substrate 1 is divided into a scribe line region and a circuit region.

Referring to FIG. 14, on semiconductor substrate 1, a first electrode layer 2 which will be an electrode, is formed. On the first electrode layer 2, a resist pattern 3 having an electrode pattern is formed.

Referring to FIGS. 14 and 15, using resist pattern as a mask, electrode layer 2 is etched to form electrodes 4a and 4b. Referring to FIG. 16, an interlayer insulating film 5 of $SiO_2$ is formed on semiconductor substrate 1 to cover electrodes 4a and 4b. On interlayer insulating film 5, a resist pattern 6 having openings above electrodes 4a and 4b is formed.

Referring to FIGS. 16 and 17, using resist pattern 6 as a mask, interlayer insulating film 5 is etched to form contact holes 5a and 5b in interlayer insulating film 5.

Referring to FIG. 18, a second electrode layer 7 is formed on semiconductor substrate 1 to be connected to electrodes 4a and 4b through contact holes 5a and 5b. Referring to FIGS. 18 and 19, second electrode layer 7 is patterned, and a resist pattern 8 having patterns above a portion where a registration measurement mark 9 is to be formed and above portions where main patterns 10a and 10b which are intended for the essential circuitry, hereinafter referred to as intended patterns are to be formed, for the subsequent forming of registration measurement mark 9 and intended patterns 10a and 10b.

Thereafter, using resist pattern 8 as a mask, the second electrode layer 7 is etched, and in this manner, registration measurement mark 9 and intended patterns 10a and 10b are formed.

Referring to FIG. 20, a second interlayer insulating film 11 is formed on semiconductor substrate 1 to cover registration measurement mark 9 and intended patterns 10a and 10b. Thereafter, on the second interlayer insulating film 11, a resist pattern 12 having an opening 12c above registration measurement mark 9 and openings 12a and 12b above intended patterns 10a and 10b is formed on the second interlayer insulating film 11.

At this time, positional deviations or offsets between opening 12a and intended pattern 10a and between opening 12b and intended pattern 10b are too small to be detected. Therefore, positional deviation between opening 12c and registration measurement mark 9 having larger area than intended patterns 10a and 10b is detected. The positional deviation is detected optically, that is, using a light beam, which light beam pierces through interlayer insulating film 11. When it is confirmed that the positional deviation between registration measurement mark 9 and opening 12c is within a tolerable range, it is also confirmed that positional deviation between intended pattern 10a and opening 12a is within the tolerable range, and that positional deviation between intended pattern 10b and opening 12b is also within the tolerable range.

If positional deviation between registration measurement mark 9 and opening 12c is out of the tolerable range, resist pattern 12 is removed, a new resist pattern 12 is again formed on the second interlayer insulating film 11, and by patterning the newly provided resist pattern, openings 12a, 12b and 12c are formed again. By repeating such an operation, it is ensured that positional deviation between registration measurement mark 9 and opening 12c is within the tolerable range, and thereafter, the process proceeds to the next step.

Referring to FIG. 21, using resist pattern 12 as a mask, interlayer insulating film 11 is etched to form contact holes 11a, 11b and 11c. Though not shown, a third electrode layer connected to intended patterns 10a and 10b through contact holes 11a and 11b is formed. By repeating these steps, a semiconductor device having multi-layered interconnection structure is formed. Semiconductor substrate 1 is diced along the scribe line region, and chips are formed.

The conventional semiconductor device has been manufactured through the above described method.

Referring to FIG. 20 and corresponding plan view of FIG. 22, intended patterns 10a and 10b are formed in the circuit region, while registration measurement mark 9 is formed in the scribe line region.

Referring to these Figures, accordingly, there is a level difference or step between the surface of registration measurement mark 9 and the surface of intended patterns 10a and 10b. The amount of deviation between registration measurement marks 9 and opening 12c of resist 12 is detected along X and Y directions. Here, as there is a step or level difference between registration measurement marks 9 and intended patterns 10a and 10b, even if the amount of deviation between registration measurement marks 9 and opening 12c of resist pattern 12 is within the tolerable range, this is not accurately reflected on monitoring of the intended patterns, and as a result, intended patterns 10a and 10b are sometimes undesirably deviated from openings 12a and 12b of resist pattern 12. Such deviation hinders successful connection between intended pattern 10a and an electrode formed thereon.

Such a deviation is generated because of the fact that registration measurement mark 9 and intended patterns 10a and 10b have different points of focus at the time of exposure, as there is a level difference. More specifically, such a deviation is caused by an aberration resulting from different points of focus.

FIG. 23 shows a relation between amount of deviation caused by aberration and depth of focus. Referring to FIG. 23, assuming that there is a level difference of 0.6 $\mu$m between the intended pattern in the circuit region and the registration measurement mark in the scribe line region, there is a difference of 0.06 $\mu$m in the depth of focus. In that case, it can be seen from the figure that the positional deviation caused by aberration would be 10 to 15 nm. This is the reason why the intended pattern cannot be accurately monitored utilizing the registration measurement mark.

SUMMARY OF THE INVENTION

The present invention was made to solve the above described problems and an object is to provide a semiconductor device improved to allow accurate monitoring of the intended pattern by using the registration measurement mark.

Another object of the present invention is to provide a semiconductor device improved to allow accurate monitoring of a pattern of highest importance among a plurality of patterns of different heights in the circuit region.

According to a first aspect of the present invention, the semiconductor device includes a semiconductor substrate. On the semiconductor substrate, a registration measurement mark and an intended pattern monitored by utilizing the registration measurement mark are provided. The step between the surface of the registration measurement mark and the surface of the intended pattern is made to be within ±0.2 µm.

According to the present invention, the step between the surfaces of the registration measurement mark and the intended pattern is made to be within ±0.2 µm.

Therefore, there is not much level difference between the intended pattern and the registration measurement mark. Accordingly, focusing error or focusing deviation between the intended pattern and the registration measurement mark is eliminated, and hence the positional deviation caused by aberration is also eliminated. Accordingly, it becomes possible to accurately monitor the intended pattern utilizing the registration measurement mark.

According to a second aspect of the present invention, the semiconductor substrate includes a support base provided inserted between the semiconductor substrate and the registration measurement mark. The height of the surface of the registration measurement mark from the surface of the semiconductor substrate is adjusted by the thickness of the support base.

According to the present invention, by the thickness of the support base, the step between the surface of the registration measurement mark and the surface of the intended pattern is adjusted to be within ±0.2 µm. Therefore, level difference between the intended pattern and the registration measurement mark is eliminated, and hence, focusing error or deviation between the intended pattern and the registration measurement mark is eliminated. As a result, positional deviation caused by aberration can be eliminated, and it becomes possible to accurately monitor the intended pattern utilizing the registration measurement mark.

According to a third aspect of the present invention, in the semiconductor device, the registration measurement mark is provided in the scribe line region and the intended pattern is provided in the circuit region.

According to the present invention, as the registration measurement mark is provided in the scribe line region, the circuit region can efficiently be used.

According to a fourth aspect, in the semiconductor device, there are a plurality of intended patterns having different heights from the surface of the semiconductor substrate in the circuit region. The step between the surface of the registration measurement mark and the surface of one of the plurality of intended patterns is made to be within ±0.2 µm.

According to the present invention, focusing error or deviation between a specific pattern in the circuit region and the registration measurement mark is eliminated. Consequently, positional deviation caused by aberration is eliminated, and therefore it becomes possible to accurately monitor the specific pattern utilizing the registration measurement mark. Therefore, an important pattern or a pattern of which standard is strict can be monitored accurately.

According to a fifth aspect of the present invention, in the semiconductor device, a film existing between the intended pattern and the surface of the semiconductor substrate and a film existing between the registration measurement mark and the surface of the semiconductor substrate have the same structure.

As the films have the same structure, the registration measurement mark and the intended pattern can be formed simultaneously.

According to a sixth aspect, in the semiconductor device, the planar shape of the registration measurement mark is a square with each side being 20 to 25 µm. As the registration measurement mark has large surface area, it is possible to accurately monitor the intended pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

Figure 1:
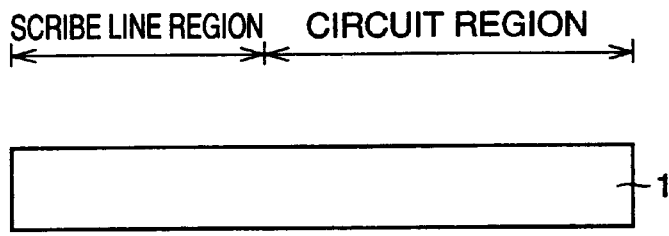
FIGS. 1 to 8 are cross sectional views of a semiconductor device in the first to eighth steps of manufacturing the semiconductor device in accordance with a fast embodiment.

Referring to FIG. 1, semiconductor substrate 1 is divided into a scribe line region and a circuit region.

Figure 2:
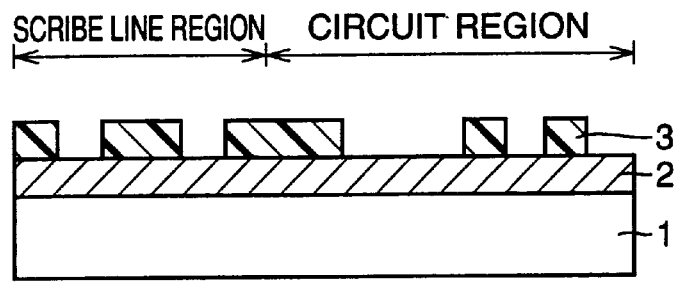

Referring to FIG. 2, electrode layer 2 is formed on semiconductor substrate 1.

Figure 3:
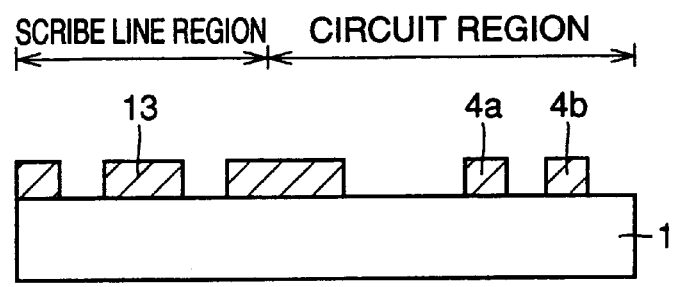

Referring to FIGS. 2 and 3, a resist pattern 3 having patterns above a support base 13 and electrodes 4a and 4b to be formed, is formed on electrode layer 2. Using resist pattern 3 as a mask, electrode layer 2 is etched to form support base 13 and electrodes 4a and 4b.

Figure 4:
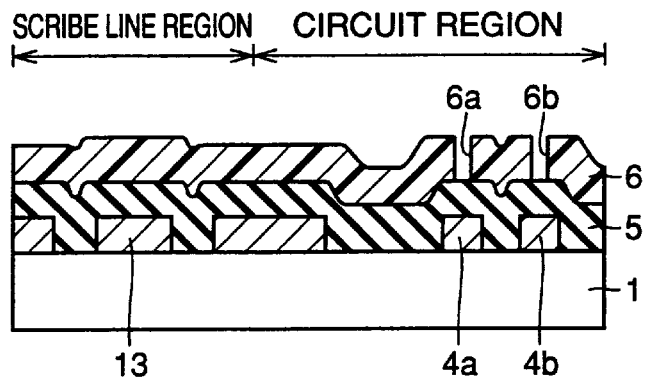

Referring to FIG. 4, interlayer insulating film 5 is formed on semiconductor substrate 1 to cover support base 13 and electrodes 4a and 4b. A resist pattern 6 having openings 6a and 6b above electrodes 4a and 4b is formed on interlayer insulating film 5.

Figure 5:
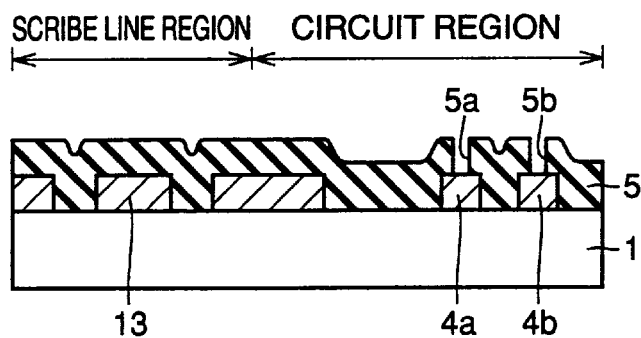

Referring to FIGS. 4 and 5, using resist pattern 6 as a mask, interlayer insulating film 5 is etched to form contact holes 5a and 5b in interlayer insulating film 5. Thereafter, resist pattern 6 is removed.

Figure 6:
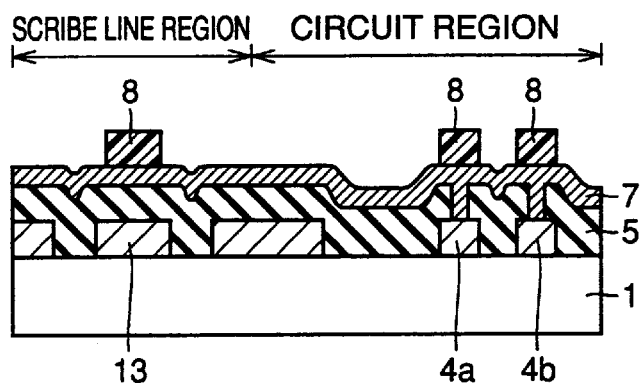

Referring to FIGS. 5 and 6, a second electrode layer 7 is formed on interlayer insulating film 5 to be connected to electrodes 4a and 4b through contact holes 5a and 5b.

Figure 7:
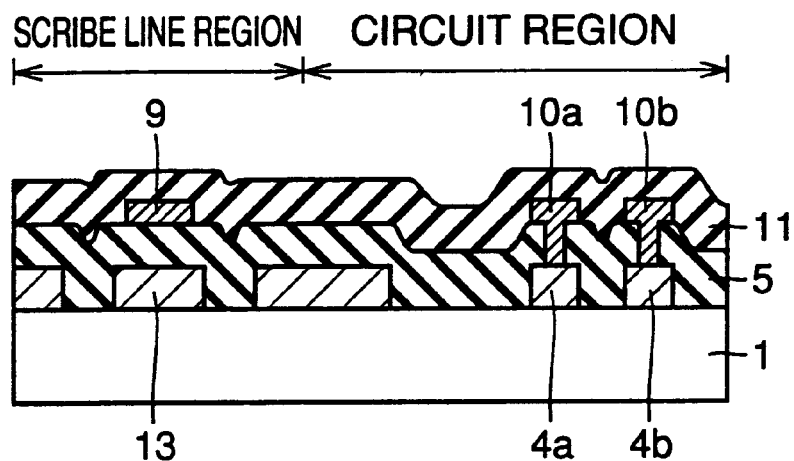

Referring to FIGS. 6 and 7, a resist pattern 8 having patterns above registration measurement mark 9 and intended patterns 10a and 10b to be formed is formed on second electrode layer 7. Using resist pattern 8 as a mask, the second electrode layer 7 is etched, to form registration measurement mark 9 and intended patterns 10a and 10b. At this time, as there is support base 13 having the same thickness as electrodes 4a and 4b, the step between the surface of registration measurement mark 9 and the surface of intended patterns 10a and 10b is made to be within ±0.2 μm.

Figure 8:
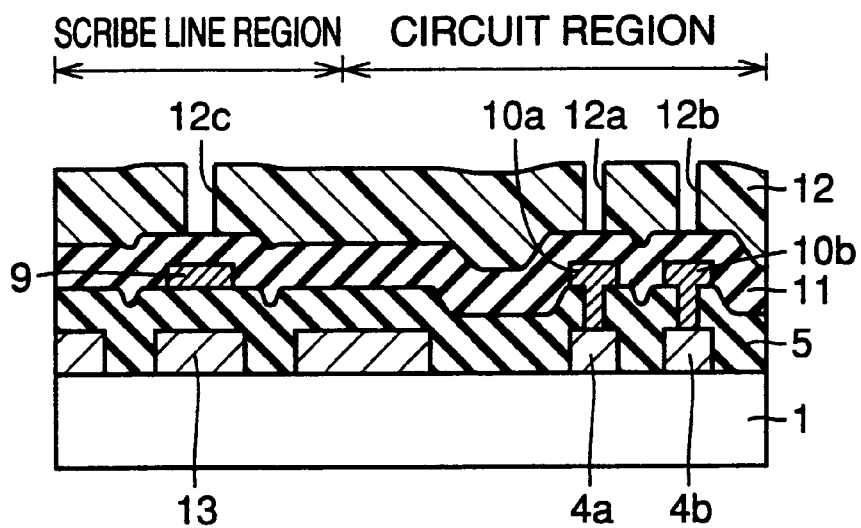

Referring to FIG. 8, a second interlayer insulating film 11 is formed on interlayer insulating film 5 to cover registration measurement mark 9 and intended patterns 10a and 10b. A resist pattern 12 having an opening 12c above registration measurement mark 9 and openings 12a and 12b above intended patterns 10a and 10b are formed on the second interlayer insulating film 11.

Figure 9:
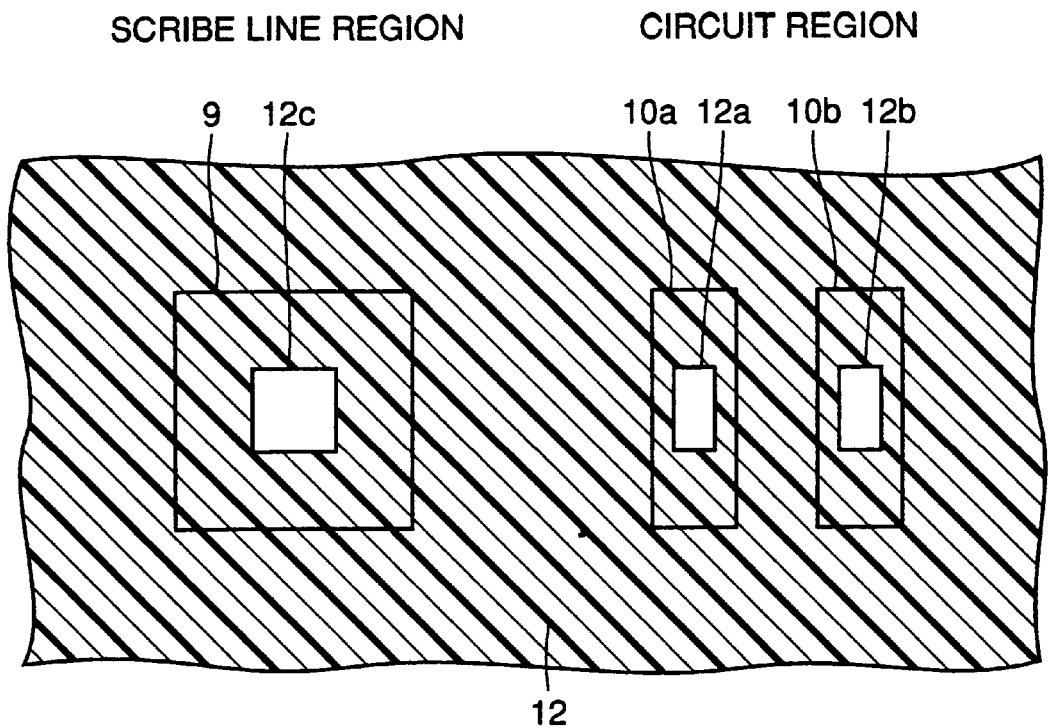
FIG. 9 is a plan view of the semiconductor device shown in FIG. 8.

FIG. 9 is a plan view of the semiconductor device shown in FIG. 8. In the present embodiment, there is not a level difference between registration measurement mark 9 and intended patterns 10a and 10b, and therefore there is not any focusing error or deviation between registration measurement mark 9 and intended patterns 10a and 10b. As a result, positional deviation caused by aberration is eliminated, and hence it becomes possible to accurately monitor the intended patterns 10a and 10b utilizing the registration measurement mark 9.

Thereafter, though not shown, using resist pattern 12 as a mask, interlayer insulating film 11 is patterned to form contact holes in interlayer insulating film 11 to expose surfaces of registration measurement mark 9 and of intended patterns 10a and 10b. Thereafter, though not shown, a next interconnection layer is formed which is connected to registration measurement mark 9 and intended patterns 10a and 10b through the thus formed contact holes. In this manner, a semiconductor device having multi-layered interconnection structure is obtained.

Second Embodiment

Figure 10:
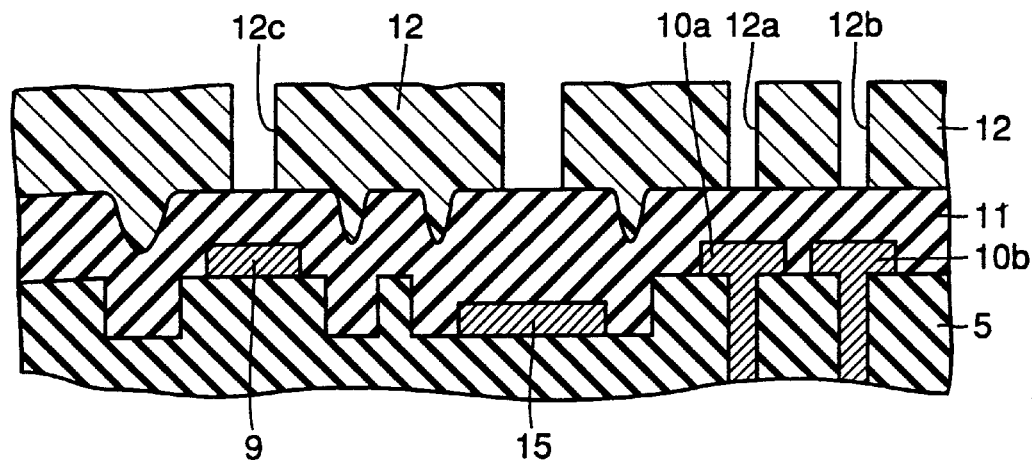
FIG. 10 is a cross sectional view of a semiconductor device in accordance with a second embodiment.

FIG. 10 is a cross sectional view of a semiconductor device in accordance with the second embodiment, which corresponds to the step shown in FIG. 8 of the first embodiment. The semiconductor device shown in FIG. 10 is similar to the semiconductor device shown in FIG. 8 except the following points. Therefore, the same or corresponding portions are denoted by the same reference characters and description thereof is not repeated.

Figure 19:
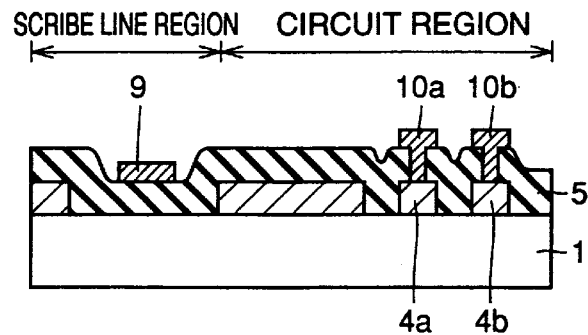
Figure 20:
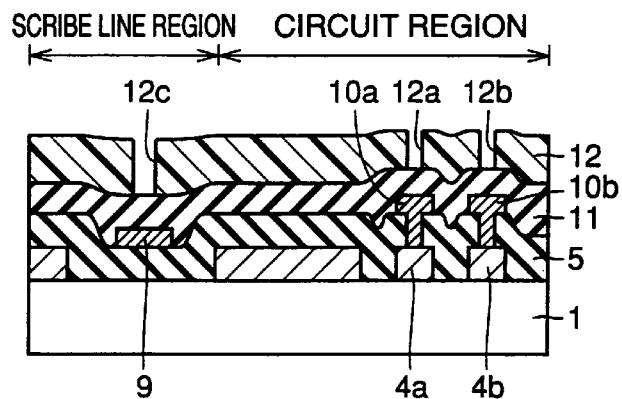
Figure 21:
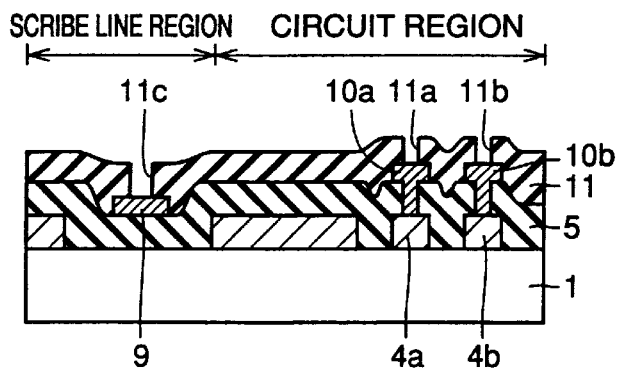
Figure 22:
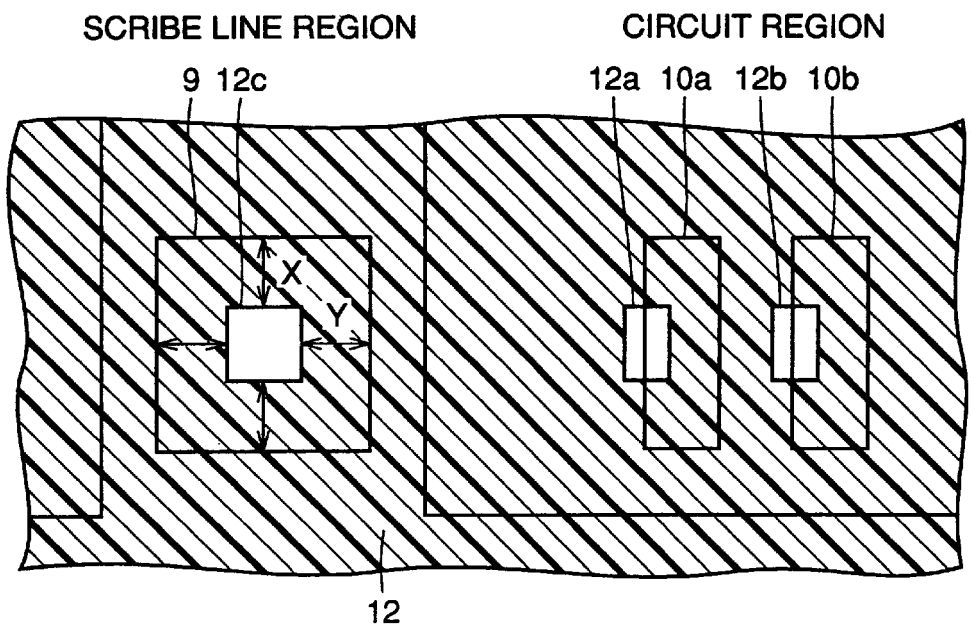
FIG. 22 is a plan view of the semiconductor device in the step shown in FIG. 20.
Figure 23:
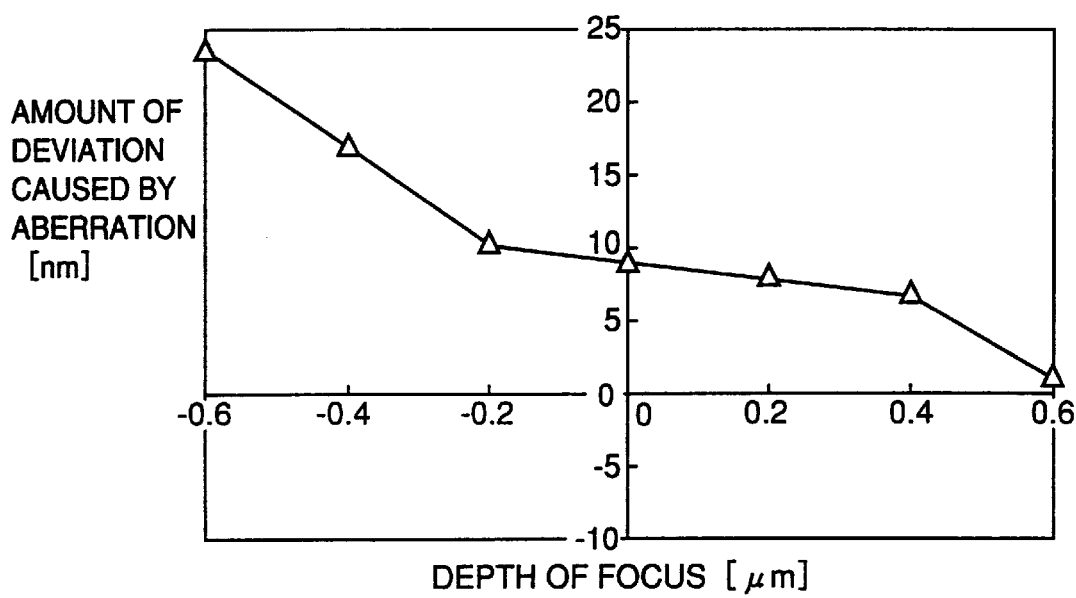
FIG. 23 shows a relation between amount of deviation caused by aberration and depth of focus.

The semiconductor device shown in FIG. 19 differs from the semiconductor device shown in FIG. 8 in that there are a plurality of intended patterns 15, 10a and 10b having different heights from the surface of the semiconductor substrate, formed in the circuit region. Though the step between the surface of registration measurement mark 9 and intended pattern 15 is not made small, the step between the surface of registration measurement mark 9 and intended patterns 10a and 10b is made to be within ±0.2 μm.

In the present embodiment, when there are a plurality of steps in the circuit region, the step of a specific pattern is addressed. In a DRAM or a logic device having a memory mounted together, there is a level difference in the memory cell and in the capacitor portion of the peripheral circuitry. In such a case, it is possible to determine whether the height of the registration measurement mark 9 should be aligned with the height of the memory cell portion or the height of the peripheral circuitry, by forming the support base below the registration measurement mark portion in the scribe line region and by adjusting the height of the support base.

For example, when the standard for registration in the memory cell portion is compared with the standard for registration in the peripheral circuitry portion and the standard of registration in the memory cell portion is more strict, the step between the surface of the registration measurement mark and the surface of the memory cell portion is made to be within ±0.2 μm by adjusting the height of the support base formed below the registration measurement mark. If the standard of registration in the peripheral circuit portion is more strict, the height of the surface of the registration measurement mark is aligned with the height of the peripheral circuitry portion, by adjusting the height of the support base at the registration portion. This eliminates focusing error or deviation between a specific pattern in the circuit region and the registration measurement mark. As a result, positional deviation caused by aberration can be eliminated, and it becomes possible to accurately monitor the intended pattern of which standard is strict, utilizing the registration measurement mark.

Figure 11:
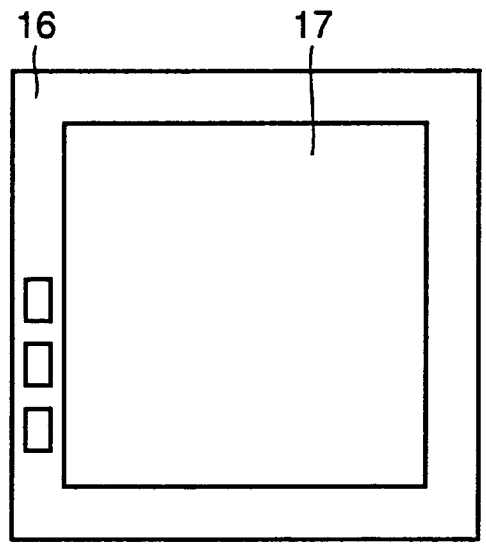
FIG. 11 is a plan view showing positional relation between a scribe line region and a circuit region in the semiconductor device in accordance with the present invention.

FIG. 11 shows positional relation between the scribe line region where the registration measurement mark is formed, and the circuit region. The scribe line region 16 surrounds the circuit region 17.

Figure 12:
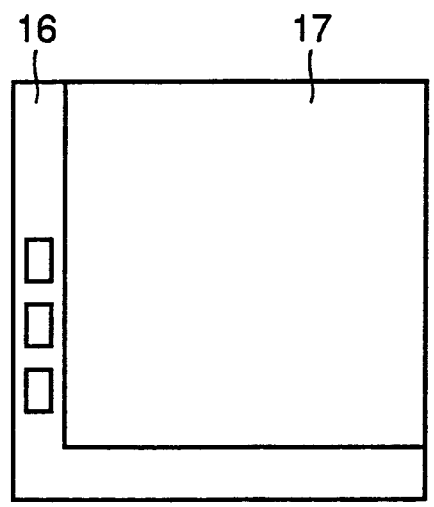
FIG. 12 is a plan view showing another positional relation between the scribe line region and the circuit region in the semiconductor device in accordance with the present invention.
Figure 13:
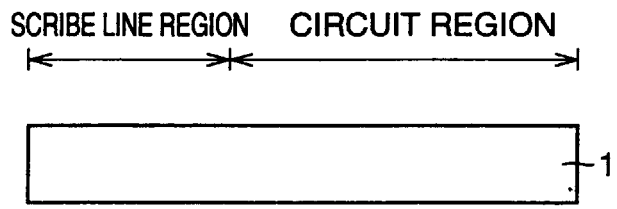
FIGS. 13 to 21 are cross sectional views of a conventional semiconductor device in the first to ninth steps of manufacturing the conventional semiconductor device.
Figure 14:
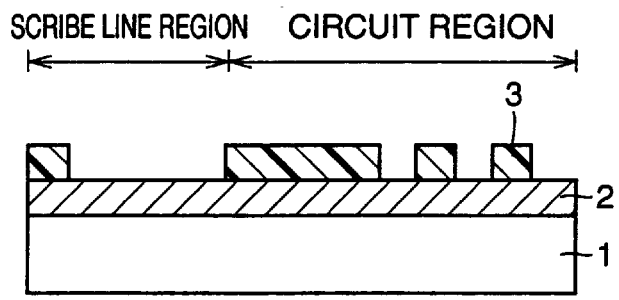
Figure 15:
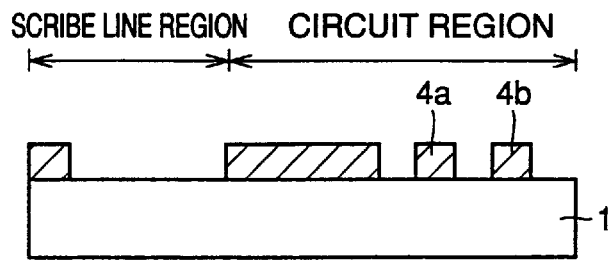
Figure 16:
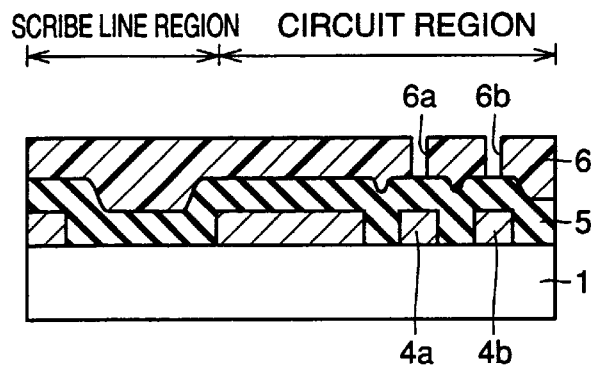
Figure 17:
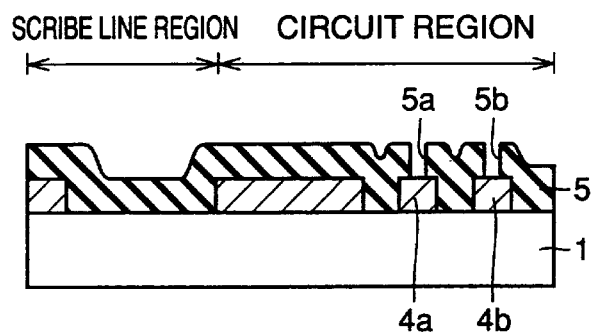
Figure 18:
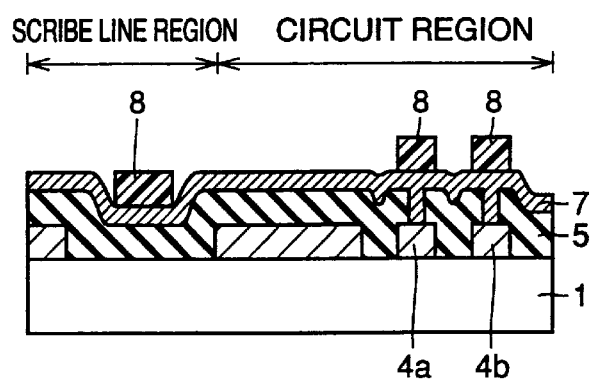

FIG. 12 shows another positional relation between the scribe line region and the circuit region. In this example, the scribe line region 16 extends along two sides of circuit region 17. Even in such a semiconductor devices, similar effects as described above can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate; and
   a registration measurement mark formed on said semiconductor substrate and an intended pattern monitored by utilizing the registration measurement mark; wherein
   a step between a surface of said registration measurement mark and a surface of said intended pattern is made to be within ±0.2 μm.

2. The semiconductor device according to claim 1, further comprising
   a support base provided inserted between said semiconductor substrate and said registration measurement mark; wherein
   height of said surface of said registration measurement mark from the surface of said semiconductor substrate is adjusted by thickness of said support base.

3. The semiconductor device according to claim 1, wherein
   said registration measurement mark is provided in a scribe line region and said intended pattern is provided in a circuit region.

4. The semiconductor device according to claim 3, wherein
   a plurality of intended patterns having different heights from the surface of said semiconductor substrate are provided in said circuit region; and a step between the surface of said registration measurement mark and a surface of one of said plurality of intended patterns is made to be within ±0.2 μm.

5. The semiconductor device according to claim 1, wherein a existing between said intended pattern and the surface of said semiconductor substrate and a film existing between said registration measurement mark and the surface of said semiconductor substrate have the same structure.

6. The semiconductor device according to claim 1, wherein planar shape of said registration measurement mark is a square with each side being 20 to 25 μm.

* * * * *